United States Patent [19]

Wu et al.

[11] 4,088,546

[45] May 9, 1978

[54] METHOD OF ELECTROPLATING INTERCONNECTIONS

[75] Inventors: Shu-Yau Wu, Churchill Borough, Pa.; Nathan Bluzer, Silver Spring, Md.; Maurice H. Francombe, Pittsburgh, Pa.; Arthur S. Jensen, Baltimore City, Md.

[73] Assignee: Westinghouse Electric Corp., Pittsburgh, Pa.

[21] Appl. No.: 773,380

[22] Filed: Mar. 1, 1977

[51] Int. Cl.² .......................... C25D 5/02; B01J 17/00
[52] U.S. Cl. .................................. 204/15; 29/577 R; 29/628
[58] Field of Search ............... 204/15, 16, 40; 29/577, 29/588, 628

[56] References Cited

U.S. PATENT DOCUMENTS

| 2,834,723 | 5/1958 | Robinson | 204/15 |
| 3,805,375 | 4/1974 | La Combe et al. | 29/577 |
| 3,903,590 | 9/1975 | Yokogawa | 29/588 |
| 3,950,233 | 4/1976 | Rosvold | 204/15 |

Primary Examiner—T. M. Tufariello
Attorney, Agent, or Firm—R. M. Trepp

[57] ABSTRACT

A method of forming interconnections is described wherein small gaps between contacts are bridged by electroplating metal onto both contacts to form a conductive path therebetween. Many interconnections may be made simultaneously between adjacent contacts by bridging the gap with metal by electroplating.

7 Claims, 12 Drawing Figures

METHOD OF ELECTROPLATING INTERCONNECTIONS

BACKGROUND OF THE INVENTION

1. Field of the Invention

This invention relates to electrical interconnections, and more particularly to a method of forming electrical interconnections across gaps by electroplating.

2. Description of the Prior Art

In the prior art electrical interconnections between miniature components such as integrated circuits and infrared detectors, for example, were made by wire bonding, flip-chip or beam-lead. In wire bonding, a gold or aluminum wire having a diameter of approximately 25 microns is attached to an electrode contact pad on the upper surface of a substrate by a thermal compression bond, a wedge bond, or an ultrasonic bond. The electrode contact pad is usually rectangular in shape and larger than 50 microns by 50 microns to permit the wire to be deformed without going off the contact and to permit a margin of operator error in the placement of the wire on the contact. The wire bonds were usually made between the surface of the component or integrated circuit and a supporting substrate having interconnecting metalization including a metalization contact pad for connection of the other end of the wire by bonding.

Flip-chip interconnections are usually formed by specially preparing the component to have raised contact pads which are faced downwards or positioned towards a substrate, which has matching contact pads; and all such component contact pads are simultaneously bonded to the substrate contact body by solder reflow or thermal compression bonding. Beam-lead interconnections are formed by using a specially prepared integrated circuit chip having cantilevered beams extending outwardly over the edge of the chip from the normal contact pad positions. The ends of the cantilevered beams are then bonded to metalization pads located on a supporting substrate. The plane of the beams may be aligned with the plane of the metalization of the substrate by insetting the components in the substrate or by inverting the components and having the beams connected to the substrate face down. The beams are bonded to the metalization of the substrate by thermal compression bonding or by ultrasonic bonding which may occur simultaneously for all beams or individually. Components which are interconnected on a common substrate or between themselves utilizing thin and thick film metalizations and wire, flip-chip or beam-lead bonding are referred to by those skilled in the art as hybrid circuits. The hybrid circuit is normally contained within a hermetically sealed package.

The advantages inherent in the present invention can be appreciated if we consider a particular application of this invention to the infrared focal plane assemblies. In infrared imaging systems, hundreds of detectors are fabricated on the focal plane. Conventional interconnecting techniques do not permit contact pads smaller than 50 microns in size. In such applications, each detector is approximately 30 microns × 30 microns in size with small detector to detector spacing. The small electrical contact size imposed by such detector size and the center-to-center spacing renders electrical interconnection cumbersome to couple directly the detectors on one component to signal processing circuitry on adjacent silicon integrated circuit chips.

Likewise, in the mounting of silicon integrated circuit (IC) chips in multiple chip hybrid packages (MHP) the number of bonding wires can be as high as a thousand, with a bond at each end. The probability of operator error is high when hand-bonded. In a machine bond operation, set-up and even operation time is long. On the other hand, bonding by the method taught by this invention would be quick, reliable and accurate. It would require only that the MHP substrate be mortised to receive the IC chips such that they be coplanar with the substrate.

In one particular embodiment in which this invention has been used, infrared detectors made of lead tin telluride were formed in an array. Each detector in the array was bonded by the electroplating method taught in this invention to its individual input contact in the integrated circuit (IC) which was formed on a silicon chip. Since the lead tin telluride is very soft conventional bonding techniques that require considerable pressure would have deformed or mechanically damaged the detection array. This invention has the advantage of not requiring any mechanical pressure so that it does not deform or damage the materials underneath the interconnections.

It is therefore desirable to be able to electrically interconnect on a small center-to-center spacing, the contacts of one component containing infrared detectors to contacts on another component containing signal processing circuitry such as charge coupled device shift registers, for example. It is desirable that the electrical interconnections between different circuit components may be made between contacts on the components having contact spacings of 100 microns or less. Furthermore, it is desirous that hundreds of interconnections may be made between two or more circuit components simultaneously.

SUMMARY OF THE INVENTION

In accordance with the present invention, a method is provided for interconnecting contacts on different components comprising the steps of positioning contacts at the edge of a first component, positioning contacts at the edge of a second component, positioning the edge of the first component in close proximity with the edge of the second component with contacts on the first component adjacent to contacts on the second component, selectively depositing metal on the first and second components to interconnect predetermined contacts on the first component to a first electrode and to interconnect predetermined contacts on the second component to a second electrode, selectively electroplating metal on the predetermined contacts of the first and second components from a distance inside the edge of the first component to a distance inside the edge of the second component to form metalization paths from the predetermined contacts on the first component to the adjacent predetermined contacts on the second component, and removing portions of the selectively deposed metal to disconnect the predetermined contacts on the first component from the first electrode and to disconnect the predetermined contacts on the second component from the second electrode.

In one particular application, the first component may contain a number of infrared detectors and the second component may contain suitable signal processing circuitry.

DESCRIPTION OF THE PREFERRED EMBODIMENTS

Figure 1A:
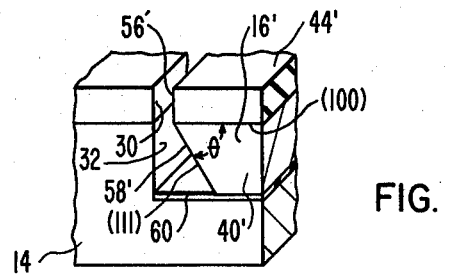
FIG. 1A shows an alternate edge shape of one of the components.
Figure 1:
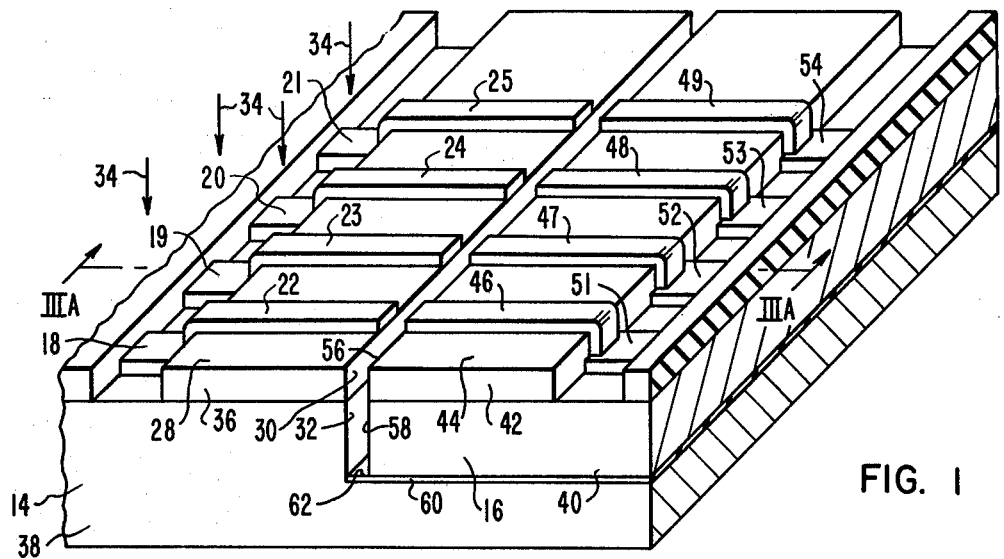
FIG. 1 is a perspective view of two circuit components each with contacts positioned along an edge.

Referring to FIG. 1, a perspective view is shown of a first circuit component 14 and a second circuit component 16. First circuit component 14 contains a linear array of planar infrared photodiodes 18 through 21 having metalization contacts 22 through 25 connected to the front terminal of photodiodes 18 through 21 and extending along the upper surface 28 to edge 30 of circuit component 14. Edge 30 is formed by the intersection of the upper surface 28 and a side surface 32 of first circuit component 14. First circuit component 14 may for example be composed of a single crystal of lead tin telluride and exhibit a P-type semiconductor characteristic. The photodiodes may have been formed by diffusing indium into the lead tin telluride crystal to a depth of 100 angstroms or less to form a PN junction. Metalization contacts 22 through 25 may be formed by first vacuum depositing chrome to a thickness of approximately 200 angstroms followed by a vacuum deposition of gold to a depth of approximately 2,000 angstroms. Alternately metalization contacts 22 through 25 may be formed by vacuum-deposited lead to a depth of 5,000 angstroms followed by a vacuum deposition of gold to a depth of 7,000 angstroms for the gold. The metalization contacts 22 through 25 may also be fabricated by vacuum-depositing titanium to a depth of 200 angstroms followed by a vacuum deposition of gold to a depth of 2,000 angstroms for the gold. Infrared radiation 34 from a field of view may be focused upon upper surface 28 and impinge upon photodiodes 18 through 21 whereupon signals are generated upon metalization contacts 22 through 25. Metalization contacts 22 through 25 may, for example, have a width of 10 microns and photodiodes 18 through 21 may, for example, be rectangles having a side dimension of 30 microns × 30 microns and a spacing between photodiodes of 10 microns corresponding to a center-to-center spacing of 40 microns for the photodiodes. An insulation layer 36, for example, electron-beam deposited silicon dioxide forms the upper surface of first circuit component 14 to protect the photodiodes and to insulate the metalization contacts 22 through 25 from short circuiting to the substrate 38 composed of lead tin telluride. The substrate 38 may, for example, have a thickness in the range from 0.38 to 0.64 millimeters.

A second circuit component 16 may have a silicon substrate 40 covered by a layer 42 of silicon dioxide to provide insulation. Above layer 42 is upper surface 44 of second circuit component 16. Silicon dioxide layer 42 may, for example, be from 500 to 10,000 angstrom thick. Upon upper surface 44 are metalization contacts 46 through 49. Metalization contacts 46 through 49 extend from internal circuit contacts 51 through 54 to the edge 56 of circuit component 16. Edge 56 is formed by the intersection of surface 44 with side surface 58. Circuit contacts 51 through 54 may, for example, provide connections through the silicon dioxide layer 42 to circuitry in silicon substrate 40, not shown, for providing signal processing. Circuitry suitable for signal processing may, for example, be charge coupled devices. The invention provides a method for coupling signals from metalization contacts 22 through 25 to the metalization contacts 46 through 49 by providing conductive paths or bridges which will span the distance or gap between edge 30 and edge 56.

As shown in FIG. 1, second circuit component 16 is mounted on first circuit component 14 with edge 30 in close proximity to edge 56 with metalization contacts 22 through 25 juxtaposed or adjacent metalization contacts 46 through 49. The distance separating edge 30 from edge 56 may, for example, be in the range from 5 to 100 microns. Second circuit component 16 may be attached to the first circuit component 14 using a lead tin solder or epoxy. Silicon substrate 40 however is insulated from crystalline substrate 38 by means of an insulation layer 60 which may be formed at the same time insulation layer 36 is formed and composed of silicon dioxide. Metalization contacts 46 through 49 may be formed of any of the same combination of materials previously recited suitable for forming metalization contacts 22 through 25.

First circuit component 14 may be shaped such as by lapping to provide a flat surface 62 to support second circuit component 16. The side surface 32 may also be lapped to provide a flat surface to enable second circuit component 16 and its side surface 58 to be brought in close proximity so that edge 30 and edge 56 are in close proximity. Side surface 58 may be formed by utilizing photoresist and etching to expose the (111) plane as the side surface 58. If the upper surface of silicon substrate 40 is in the (110) plane and the side surface 58 is in the (111) plane, then the side surface 58 will be orthogonal to the upper surface. If however the upper surface is in the (100) plane, then the side surface 58' as shown in FIG. 1A will be at an angle $\theta$ with the upper surface of silicon substrate 40'. In FIG. 1A like references are used for functions corresponding to the apparatus of FIG. 1. In FIG. 1A, edge 30 is brought to within a few microns of edge 56' to allow for the subsequent plating operation. It is understood that silicon substrate 40' is insulated from crystalline substrate 38 by insulation layer 60.

Figure 2:
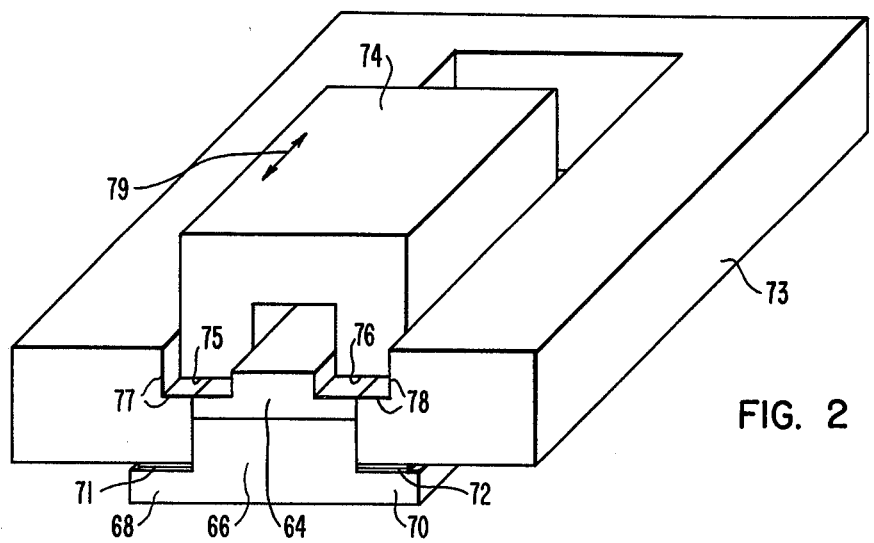
FIG. 2 shows a special lapping jig.

Crystalline substrate 38 may be thinned down or lapped utilizing the special lapping jig shown in FIG. 2. In FIG. 2 crystalline substrate 64 is shown glued to an aluminum base 66 having side flanges 68 and 70. Above side flanges 68 and 70 are layers or spacers of thin metal foil 71 and 72. Spacer and guide block 73 has portions on either side of crystalline substrate 64 and is supported by side flanges 68 and 70 together with spacers of thin metal foil 71 and 72. Above crystalline substrate 64 is lapping block 74 having lower lapping surfaces 75 and 76 which rest in part upon crystalline substrate 64 and guides 77 and 78 of spacer and guide block 73. Lapping block 74 may be moved by hand back and forth in the direction shown by arrow 79 while being guided by guides 77 and 78. A suitable polishing agent is placed between lapping surfaces 75 and 76 and the crystalline substrate 64 to facilitate the machining or thinning of the crystalline substrate 64 as shown in FIG. 2.

As the crystalline substrate is thinned or machined to a predetermined thickness, successive layers of thin metal foil 71 and 72 are removed between aluminum base 66 and spacer and guide block 73 to allow lapping block 74 to thin or machine the crystalline substrate 64 in a controlled manner to a new thickness. The right half side of crystalline substrate 64 in the view as shown in FIG. 2 corresponds to crystalline substrate 38 shown in FIG. 1. Lapping of crystalline substrate 64 in the manner shown in FIG. 2 results in a flat surface such as surface 62 of FIG. 1 and a flat side surface such as surface 32 of FIG. 1. The depth of lapping or thinning of crystalline substrate 64 is chosen to allow the upper surface 44 of the second circuit component 16 and its edge 56 to be in close proximity and adjacent edge 30 of the first circuit component 14. A suitable polishing agent may, for example, be aluminum oxide.

Figure 3G:
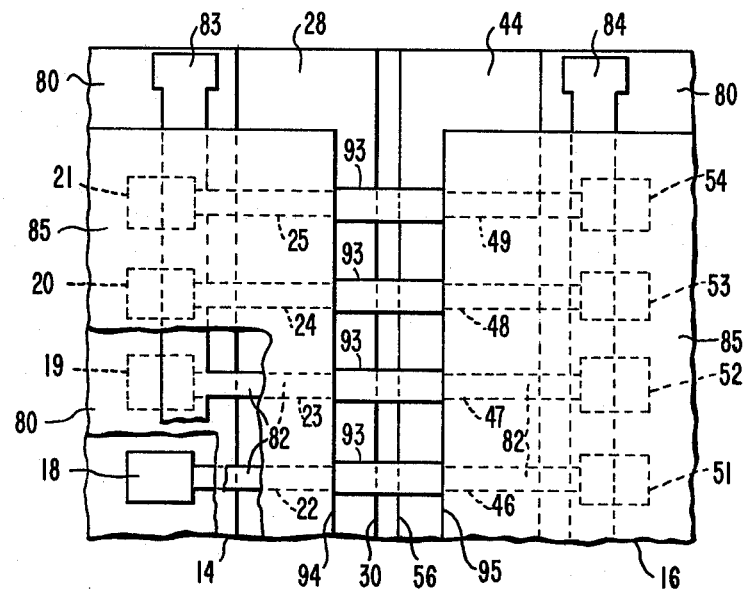
FIG. 3G shows a top view of FIG. 3F.
Figure 3A:
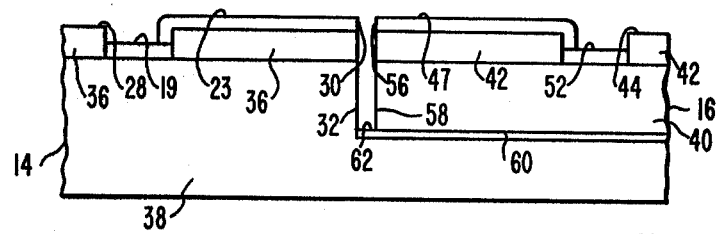
FIG. 3A shows a cross-section view along the lines IIIA—IIIA of FIG. 1.
Figure 3B:
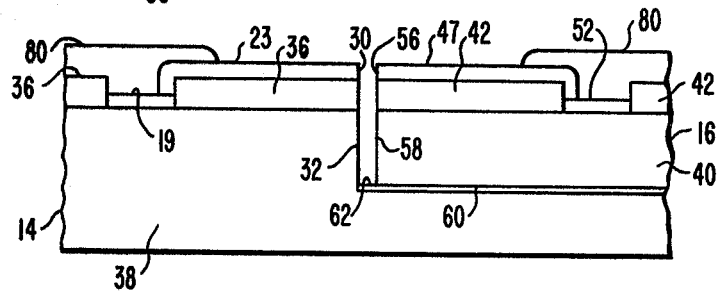
FIGS. 3B through 3F show a cross-section view along the lines IIIA—IIIA of FIG. 1 except modified to illustrate the various steps of the method according to the present invention.
Figure 3C:
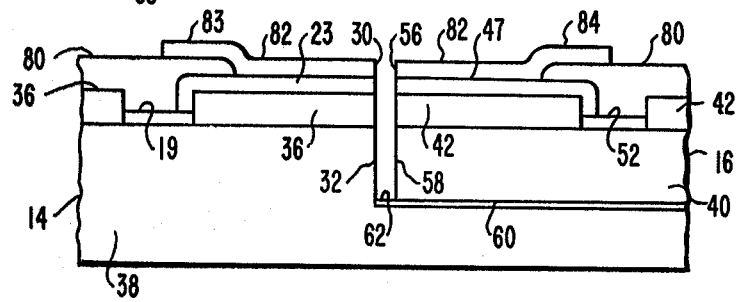

FIG. 3A shows a cross-section view along the lines IIIA—IIIA of FIG. 1. FIGS. 3B through 3F show a cross-section view along the lines IIIA—IIIA of FIG. 1 except modified to illustrate the various steps of the method according to the present invention. In FIG. 3A, second circuit component 16 is mounted on a portion of first circuit component 14 with edge 30 positioned in close proximity to edge 56. In FIG. 3B, an insulation layer 80 is deposited over portions of first circuit component 14 and second circuit component 16 to cover photodiodes 18 through 21 on the first circuit component 14 and internal circuit contacts 51 through 54 on the second circuit component 16. The insulation layer 80 may, for example, be a photoresist layer which may subsequently be dissolved in order to remove or wash out portions of metalization 82 which was deposited on top of the insulation 80. The position of the insulation is shown in FIGS. 3B and 3G. In FIG. 3C, metalization 82 is deposited over the upper surface of first circuit component 14 and second circuit component 16 to form first electrode 83 and second electrode 84 over top of insulation layer 80 and to connect predetermined contacts on the first circuit component 14 to first electrode 83 and predetermined contacts on second circuit component 16 to second electrode 84. One example of an interconnecting pattern for metalization 82 is shown in FIG. 3G. The pattern may be determined by vacuum deposition through a mask or by utilizing photoresist and etching.

Figure 3D:
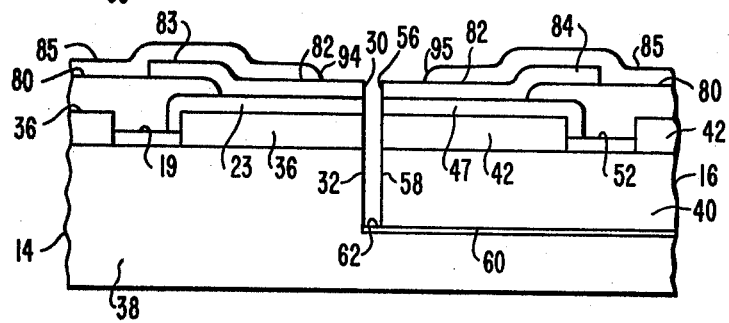

In FIG. 3D, a second insulation layer 85 is deposited over metalization 82 in selected areas where subsequent electroplating is not desired. Of course, if all exposed metal regions connected to electrodes 83 or 84 may be built up with metalization by electroplating, then the step of depositing insulation layer 85 may be eliminated. Insulation layer 85 may extend over insulation layer 80 and other metalization to prevent contact with the electroplating solution in the subsequent operation. Insulation layer 85 may, for example, be a photoresist which may be simultaneously dissolved when insulation layer 80 is being removed. An example of a pattern for insulation layer 85 on the first component 14 and the second circuit component 16 is shown on FIG. 3G. On circuit component 14, insulation layer 85 starts at a distance from edge 30 such as at insulation edge 94 to allow metal to be electroplated back from edge 30 to edge 30 and across the gap towards edge 56. Likewise on circuit component 16 insulation layer 85 starts at a distance from edge 56 such as at insulation edge 95 to allow metal to be electroplated back from edge 56 to edge 56 and across the gap towards edge 30. In other words, the insulation layer 85 is not deposited from a distance inside edge 30 on the first circuit component 14 to a distance inside the edge 56 on a second circuit component 16 to permit buildup of metalization 93 due to electroplating in the subsequent operation. Note also that first electrode 83 and second electrode 84 have portions left exposed without the insulation layer 85 to provide electrical contact to electrodes 83 and 84 from a power supply.

Figure 4:
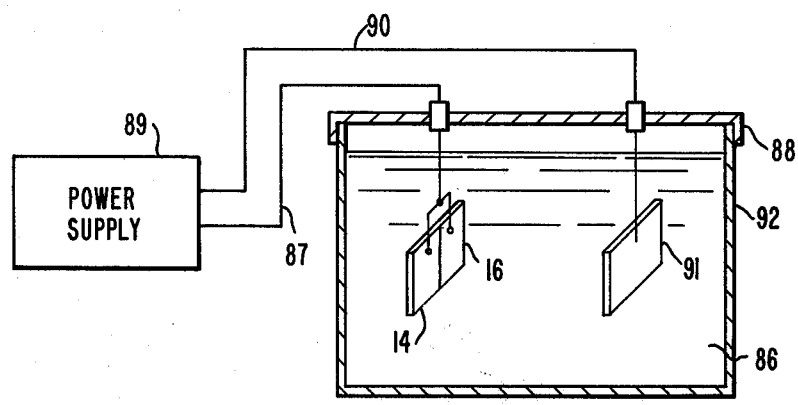
FIG. 4 is a diagram of an electroplating arrangement.

Referring now to FIG. 4, first and second circuit components 14 and 16 are placed in a suitable plating solution 86 with electrodes 83 and 84 connected together electrically to line 87 which leads out of the solution 86 through support member 88. Line 87 is coupled to one output terminal of power supply 89. A second output terminal of power supply 89 is coupled to line 90 which passes through support member 88 to electrode 91 which may, for example, be composed of platinum. Plating solution 86 is contained within container 92. Support member 88 functions to support and position the first and second components 14 and 16 and electrode 91 in the plating solution 86. Support member 88 may rest upon the top of container 92. Power supply 89 may, for example, be a pulsed power supply having single negative or double polarity pulses. For single polarity pulses, line 90 should be at ground potential and line 87 should be pulsed to a negative voltage to cause current to flow in plating solution 86 and metal to build up on the exposed portions of electrodes 83 and 84. A suitable current for plating is dependent upon the exposed surface areas of the electrodes 83 and 84. A current density for plating may be in the range from 0.1 amps per centimeter squared to 1 amp per centimeter squared. A typical duty cycle of the pulses is 50 percent. If double polarity pulses are used, then line 87 will go negative with respect to line 90 and then line 90 will go negative with respect to line 87. The duty cycle where line 87 goes negative with respect to line 90 is about 90%. Utilizing double polarity plating pulses as described above will result in metal being plated onto the exposed portions of electrodes 83 and 84 on first and second circuit components 14 and 16 for 90% of the time followed by removal of metal for about 10% of the time. The effect of double-polarity pulse plating is to cause the appearance of the metal plated to be shiny and to have a smoother and more uniform finish. Suitable metal to be plated are gold, silver, copper and nickel. One example of a gold plating solution which is commercially available is type GV70 manufactured by the Sel-Rex Company which is a Division of OXY Metal Finishing Corporation.

Figure 3E:
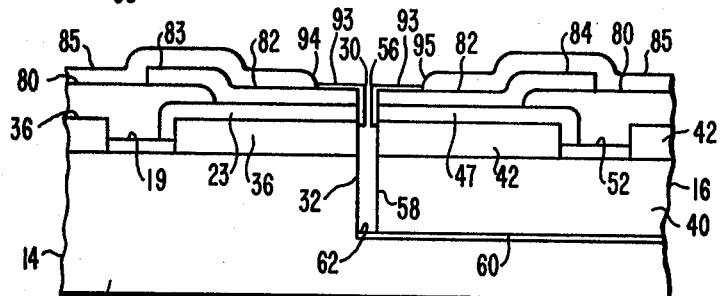

After about a minute or so of plating gold on the exposed metal connected to electrode 83 or 84 on the first and second circuit components 14 and 16, the spacing or gap between edge 30 and edge 56 will be less due to the buildup or plating of gold 93. FIG. 3E shows the buildup of gold 93 due to plating for a minute or so as compared to the original metalization before plating as shown in FIG. 3D. As shown in FIG. 3E the metalization due to electroplating appears to build up faster or thicker between edges 30 and 56, then upwards or widthwise. Measurements have been made of the electroplated growth of gold 93. The measurements show that the growth of the electroplated metalization 93 from each edge 30 and 56 towards each other is faster than the metalization 93 growth on the other exposed surfaces of metalization 82.

Figure 5:
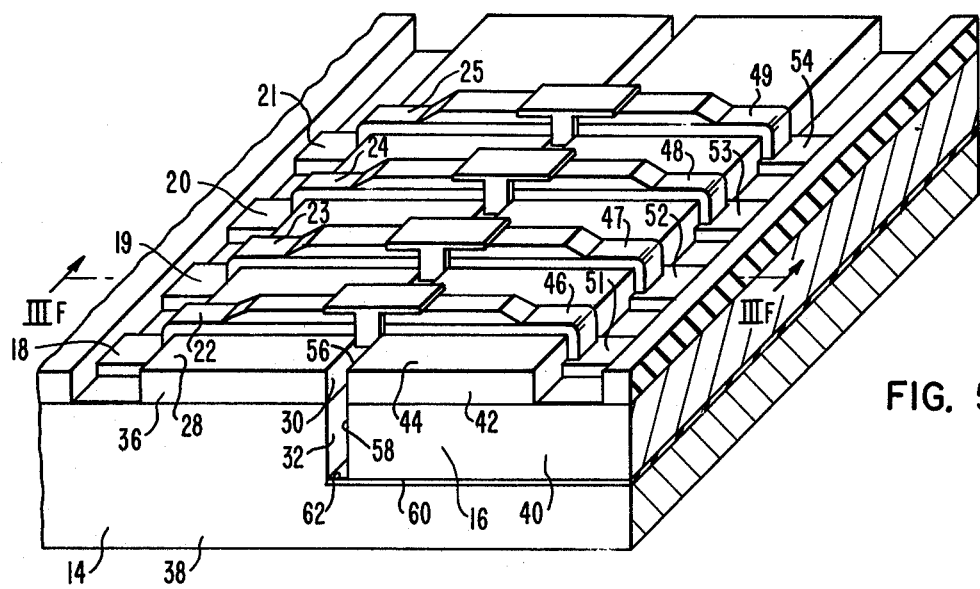
FIG. 5 is a perspective view of two circuit components of FIG. 1 after electrical interconnections of the contacts has been made utilizing the method according to the present invention.
Figure 3F:
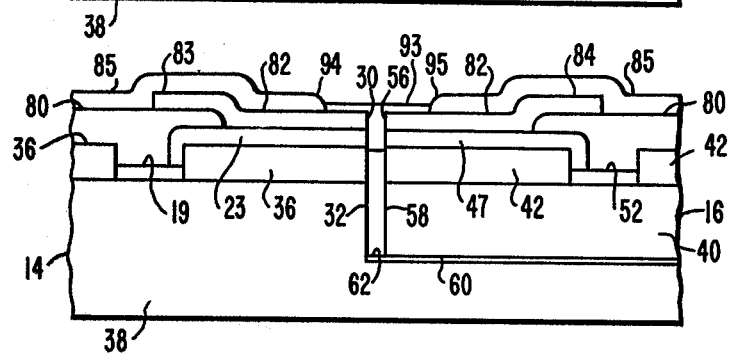

FIGS. 3F and 3G show electroplated gold interconnections 93 formed between metalization contact 23 and 47 after 2 or 3 minutes of electroplating gold. A perspective view of the metalization interconnection due to electroplating of gold is shown in FIG. 5. Note that the metalization 93 has completely filled the volume between the contacts on the first circuit component 14 and the contacts on the second circuit component 16. The metalization due to plating extends for a distance inside edge 30 to the start of insulation layer 94. The electroplating extends for a distance from edge 56 to the start of insulation layer 95.

Following the electroplating step the insulation layers 85 and 80 are removed to provide a means of removing electrodes 83 and 84 and a portion of metalization 82 which were previously supported by insulation layer 80 and which would be washed away in areas where it was supported by insulation 80 due to rinsing the surfaces of the first and second circuit components 14 and 16. With electrodes 83 and 84 and a portion of metalization 82 removed, the contacts on the first and second circuit components 14 and 16 will have been disconnected from electrodes 83 and 84 and from each other. The method of interconnecting the contacts on different circuit components to each other with metalization 93 will have been completed.

It is understood that the method according to the present invention is applicable to joining contacts on components having substrates composed of either similar or dissimilar materials. The method is particularly applicable to interconnecting integrated circuits, hybrid structures, surface and bulk acoustic wave devices and pyroelectric detectors.

The invention provides a method for interconnecting contacts on different circuit components comprising the steps of positioning contacts at the edge of a first component, positioning contacts at the edge of a second component, positioning the edge of the first component in close proximity with the edge of the second component with contacts on the first component adjacent contacts on the second component, selectively depositing metal on the first and second components to interconnect predetermined contacts on the first component to a first electrode and to interconnect predetermined contacts on the second component to a second electrode, selectively electroplating metal on the predetermined contacts of the first and second components from a distance inside the edge of the first component to a distance inside the edge of the second component to form metalization paths from the predetermined contacts on the first component to the adjacent predetermined contacts on the second component, and removing portions of the selectively deposed metal to disconnect the predetermined contacts on the first component from the first electrode and to disconnect the predetermined contacts on the second component from the second electrode.

What we claim is:

1. A method for interconnecting contacts on different circuit components comprising the steps of:
    positioning contacts at the edge of a first component,
    positioning contacts at the edge of a second component,
    positioning said edge of the first component in close proximity and spaced from said edge of the second component with contacts on said first component adjacent to contacts on said second component,
    selectively depositing metal on said first and second components to interconnect predetermined contacts on said first component to a first electrode and to interconnect predetermined contacts on said second component to a second electrode,
    selectively electroplating at a current density in the range from 0.1 amperes per centimeter squared to 1 ampere per centimeter squared metal on said predetermined contacts of said first and second components from a distance inside said edge of said first component to a distance inside said edge of said second component to form metalization paths which will span the distance from said predetermined contacts on said first component to said adjacent predetermined contacts on said second component, wherein the electroplated metalization on said predetermined contacts grows towards each other faster from said predetermined contacts on said first component to said predetermined contacts on said second component than the metalization growth on the other exposed surfaces of said predetermined contacts and
    removing portions of said selectively deposited metal to disconnect said predetermined contacts on said first component from the first electrode and to disconnect said predetermined contacts on said second component from said second electrode.

2. The method of claim 1 wherein said step of positioning said edge includes the steps of:
    machining said first component to form a second surface adjacent said first edge of said first component, and
    placing said second component on said second surface of said first component.

3. The method of claim 2 wherein said step of positioning said edge includes the step of placing said first edge of said first component within 15 microns of said edge of said second component.

4. The method of claim 1 wherein said step of electroplating metal includes the step of electroplating gold.

5. The method of claim 1 wherein said step of selectively depositing metal includes the steps of:
    applying photoresist,
    removing photoresist in selected areas,
    depositing metal, and
    removing metal in selected areas.

6. The method of claim 1 wherein said different circuit components are composed of dissimilar materials.

7. The method of claim 1 wherein said different circuit components are composed of similar materials.

* * * * *